United States Patent
Komijani et al.

(10) Patent No.: US 10,804,847 B2
(45) Date of Patent: Oct. 13, 2020

(54) HARMONIC TRAP FOR VOLTAGE-CONTROLLED OSCILLATOR NOISE REDUCTION

(71) Applicant: Apple Inc., Cupertino, CA (US)

(72) Inventors: Abbas Komijani, Mountain View, CA (US); Sohrab Emami-Neyestanak, San Francisco, CA (US); Yashar Rajavi, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/274,193

(22) Filed: Feb. 12, 2019

(65) Prior Publication Data
US 2020/0259455 A1    Aug. 13, 2020

(51) Int. Cl.
*H03B 5/12*    (2006.01)
*H03B 5/18*    (2006.01)

(52) U.S. Cl.
CPC ........... *H03B 5/129* (2013.01); *H03B 5/1212* (2013.01); *H03B 5/1228* (2013.01); *H03B 5/1265* (2013.01)

(58) Field of Classification Search
CPC .... H03B 5/129; H03B 5/1228; H03B 5/1212; H03B 5/1265
USPC ............ 331/117 R, 117 FE, 167, 177 V, 181
See application file for complete search history.

(56) References Cited

U.S. PATENT DOCUMENTS

| | | | |
|---|---|---|---|
| 7,151,430 B2 | 12/2006 | Mattsson | |
| 9,312,060 B2 | 4/2016 | Godoy et al. | |
| 9,543,068 B2 | 1/2017 | Aboush et al. | |
| 9,741,714 B2 | 8/2017 | Gertenbach et al. | |
| 2008/0266005 A1* | 10/2008 | Jacobsson | H03J 3/32 331/108 A |
| 2012/0244802 A1* | 9/2012 | Feng | H04B 5/0087 455/41.1 |
| 2015/0364242 A1* | 12/2015 | Aboush | H03L 7/099 336/192 |
| 2018/0277301 A1* | 9/2018 | Mika | H03B 27/00 |
| 2018/0351528 A1* | 12/2018 | Liu | H03B 5/1203 |

FOREIGN PATENT DOCUMENTS

EP              2689456        7/2017

* cited by examiner

*Primary Examiner* — Richard Tan
(74) *Attorney, Agent, or Firm* — Kowert, Hood, Munyon, Rankin & Goetzel, P.C.; Erik A. Heter

(57) ABSTRACT

A voltage controlled oscillator (VCO) having a harmonic trap is disclosed. A VCO includes first and second transistors cross-coupled with one another. The VCO further includes a first inductor having first and second loops coupled to one another, wherein the first inductor is arranged such that current flow through first loop is in the opposite direction of current flow in the second loop. The VCO further includes a second inductor that implements a third loop surrounding the first inductor.

20 Claims, 7 Drawing Sheets

HARMONIC TRAP FOR VOLTAGE-CONTROLLED OSCILLATOR NOISE REDUCTION

BACKGROUND

Technical Field

This disclosure is directed to electronic circuits, and more particularly, to voltage controlled oscillators.

Description of the Related Art

Voltage controlled oscillators (VCOs) are widely used in electronic systems. A VCO is an electronic circuit that produces a periodic signal that is based on a voltage provided thereto. For example, in radio frequency (RF) communications systems, a VCO may be used to implement a local oscillator whose output signal is provided to a mixer for up conversion or down conversion of a carrier signal. Another example of a VCO implementation is as a circuit used in generating a clock signal.

SUMMARY

A voltage controlled oscillator (VCO) having a harmonic trap is disclosed. In one embodiment, a VCO includes first and second transistors cross-coupled with one another. The VCO further includes a first inductor having first and second loops coupled to one another, wherein the first inductor is arranged such that current flow through first loop is in the opposite direction of current flow in the second loop. The VCO further includes a second inductor that implements a third loop surrounding the first inductor.

In one embodiment, the first inductor forms a figure eight. Due to this shape, the current through the two loops of the first inductor flow in opposite directions. Additionally, the current flow through one of the loops of the first inductor flows in the opposite direction of the second inductor. As a result, undesired coupling induced into the second conductor may be canceled based on current flow through the two inductors. Similarly, undesired coupling from second conductor into first conductor may be canceled based on current flow through the two inductors.

BRIEF DESCRIPTION OF THE DRAWINGS

The following detailed description makes reference to the accompanying drawings, which are now briefly described.

Figure 1:
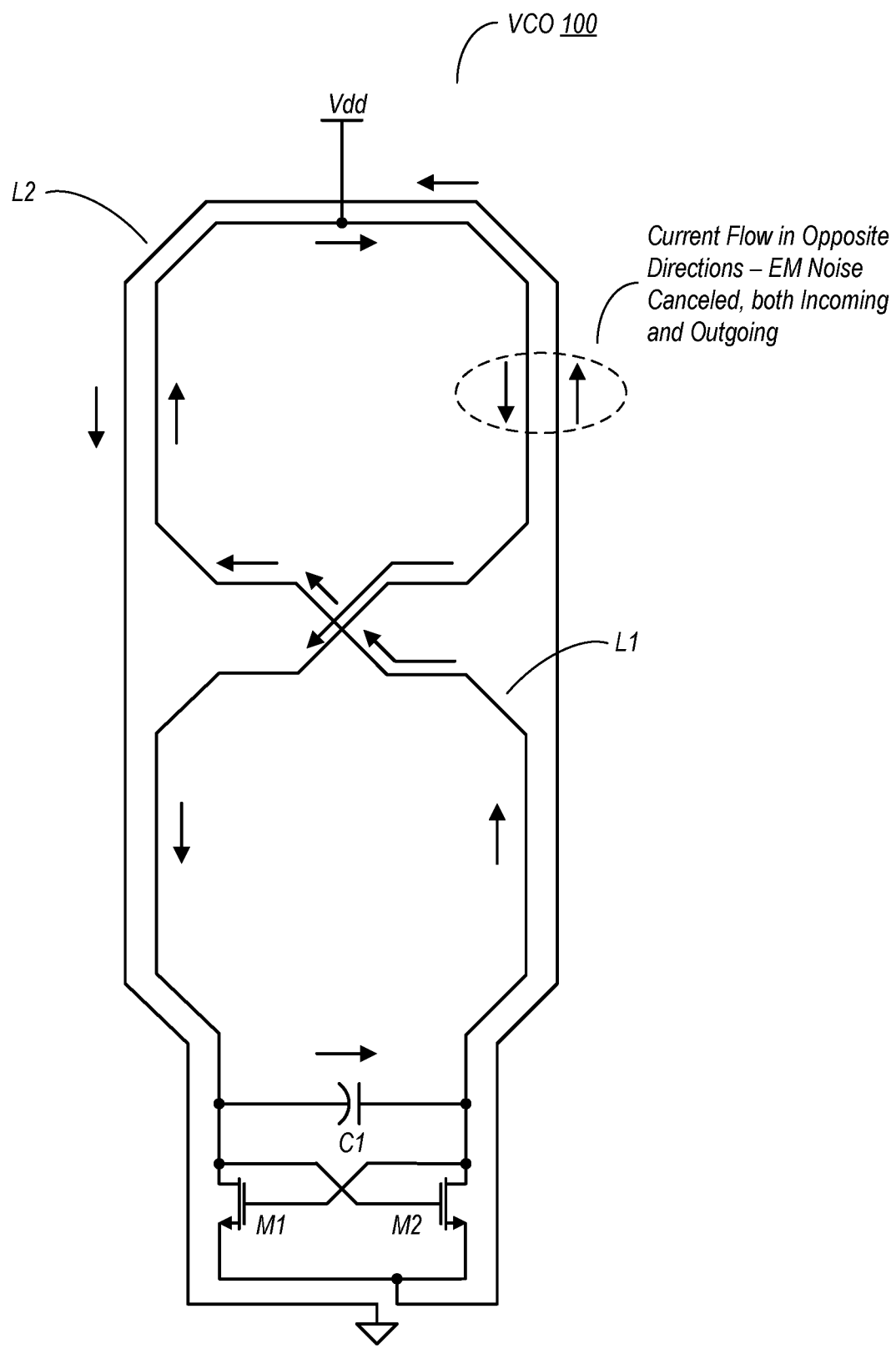
FIG. 1 is a schematic diagram of one embodiment of a VCO.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "voltage controlled oscillator configured to generate a periodic signal" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

The present disclosure is directed to a voltage controlled oscillator (VCO) having a harmonic trap for rejecting incoming noise (e.g., electromagnetic, or EM noise generated from a source external to the VCO) and for preventing noise generated by the VCO from escaping therefrom. In one embodiment, a VCO in accordance with this disclosure includes first and second inductors. The first inductor may include two separate loops, and may be arranged as a figure eight. Currents flow through one loop in a first direction (e.g., clockwise) and through the other loop in a second direction (e.g., counter clockwise). The first inductor, as well as other VCO circuitry, may be surrounded by a second inductor implemented as a loop that surrounds the VCO, which thus includes surrounding the first inductor. Current through the second inductor flows in a direction that is opposite that of one of the loops in the first inductor. As a result, EM noise induced into one of these inductors may be partially or fully canceled by the other inductor.

Turning now to FIG. 1, a diagram of one embodiment of a VCO is shown. In the embodiment shown, VCO 100 includes cross-coupled NMOS transistors M1 and M2. In particular, the drain terminal of M1 is coupled to the gate terminal of M2, and vice versa. The cross-coupled devices may generate a periodic signal, such as a sine wave or a square wave. The output from the VCO may be provided from either one of the drain terminals (in the single-ended case), or from both terminals (in the differential case).

A capacitor C1 is also coupled between the respective drain terminals of M1 and M2. The capacitance value of C1 may, in one embodiment, be selected to tune the circuit for a desired output frequency at a specified input voltage.

VCO 100 as shown here includes two inductors, L1 and L2, with the latter arranged around the periphery of the former. A supply voltage node, Vdd, is coupled to L1, from which a DC operating voltage is provided to transistors M1 and M2. This voltage may be adjustable in some embodiments, in accordance with a desired output signal frequency.

As shown here, L2 effectively surrounds L1 and more generally, the remaining circuitry of VCO 100. Inductor L1 as shown here is arranged in a figure eight, thus having two different loops connected to one another. As illustrated here, the direction of current flow in the top loop is clockwise, while the direction is counter clockwise in the bottom loop. The current through L2 in this particular example flows counter clockwise. Accordingly, the current through L2 is in the opposite direction of the current through one of the loops in the figure eight of L1.

The effect of the arrangement of the two inductor shown in FIG. 1 may be such that EM noise in the vicinity of VCO 100 may be canceled in part or in full. For example, consider external EM energy induced into inductor L2. In the example shown in FIG. 1, this EM energy may be canceled by inductor L1, particularly the upper loop, since the current flowing through upper loop of L1 and the loop that comprises L2 is in opposite directions. Generally speaking, inductors L1 and L2 may effectively be invisible to one another due to the opposing current flows. A voltage induced into one of inductors L1 and L2 may be canceled by the other one. Similarly, a magnetic field induced into one of the inductors may also be canceled by the other.

Various types of electronic noise may be canceled in full or in part by the configuration shown in FIG. 1. For example, low frequency noise referred to as 1/f noise may be canceled. Such noise may be that which is low in frequency relative to the frequency of the periodic signal output by the VCO. For example, if the VCO output signal has a frequency of 1 GHz, the circuit in the illustrated embodiment may cancel noise having a frequency of, e.g., 100 kHz.

Inductor L2 in the embodiment shown may act as a choke inductor. That is, the inductor may block EM noise at frequencies e.g., higher than the frequency of the output signal. Such tones, if left unchecked, can create sidebands that can adversely affect the operation of either the VCO itself or other circuits in the vicinity. Inductor L2 may provide a high impedance for frequencies above that of the signal output, particularly at a first harmonic (e.g., twice the frequency of the output signal) and other higher frequency harmonics. Additionally, in operating as a choke inductor, L2 may also suppress low frequency phase noise.

In addition to the above, the implementation of VCO 100 may be relatively area efficient. In particular, placing inductor L1 and the main core of the VCO within the confines of L2 effectively shares this area, thereby resulting in more efficient use of circuit area on, e.g., an IC that implements VCO 100.

Figure 2:
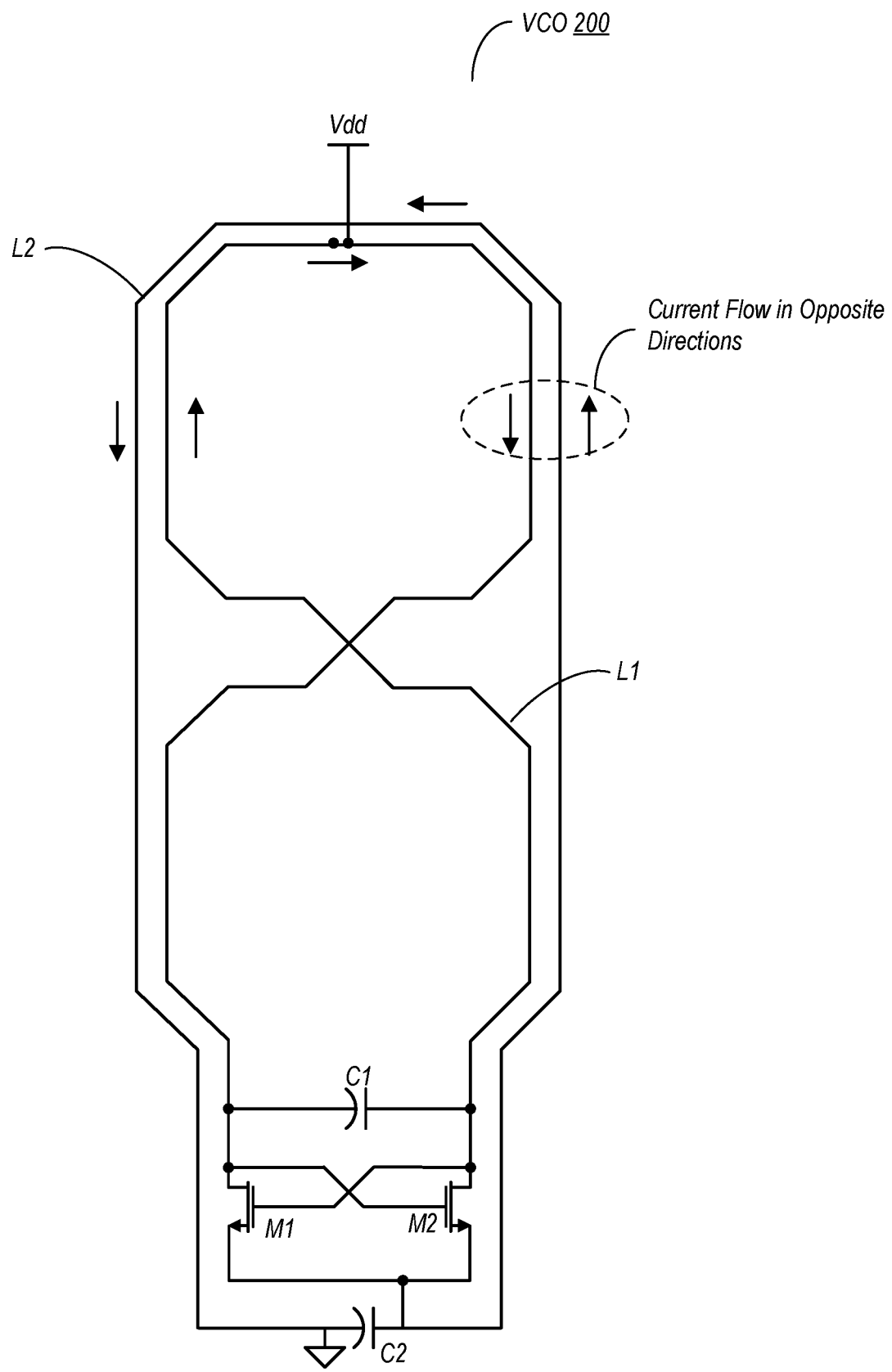
FIG. 2 is a schematic diagram of a second embodiment of a VCO.

FIG. 2 is another embodiment of a VCO. This embodiment is similar to that of FIG. 1. However, in this case, VCO 200 includes an extra capacitor, C2, implemented in the loop that forms inductor L2. The value of this capacitor may be selected based on a second harmonic (twice the fundamental frequency) of a desired output frequency of VCO 200. In this embodiment, the outer loop of L2 does not carry any fundamental frequency or odd harmonic current. When tuned based on the frequency of the first harmonic, L2 carries no current at this frequency (twice the fundamental frequency, or frequency of the VCO output signal). Accordingly, there is no inductive coupling to the main core of VCO 200.

Figure 3:
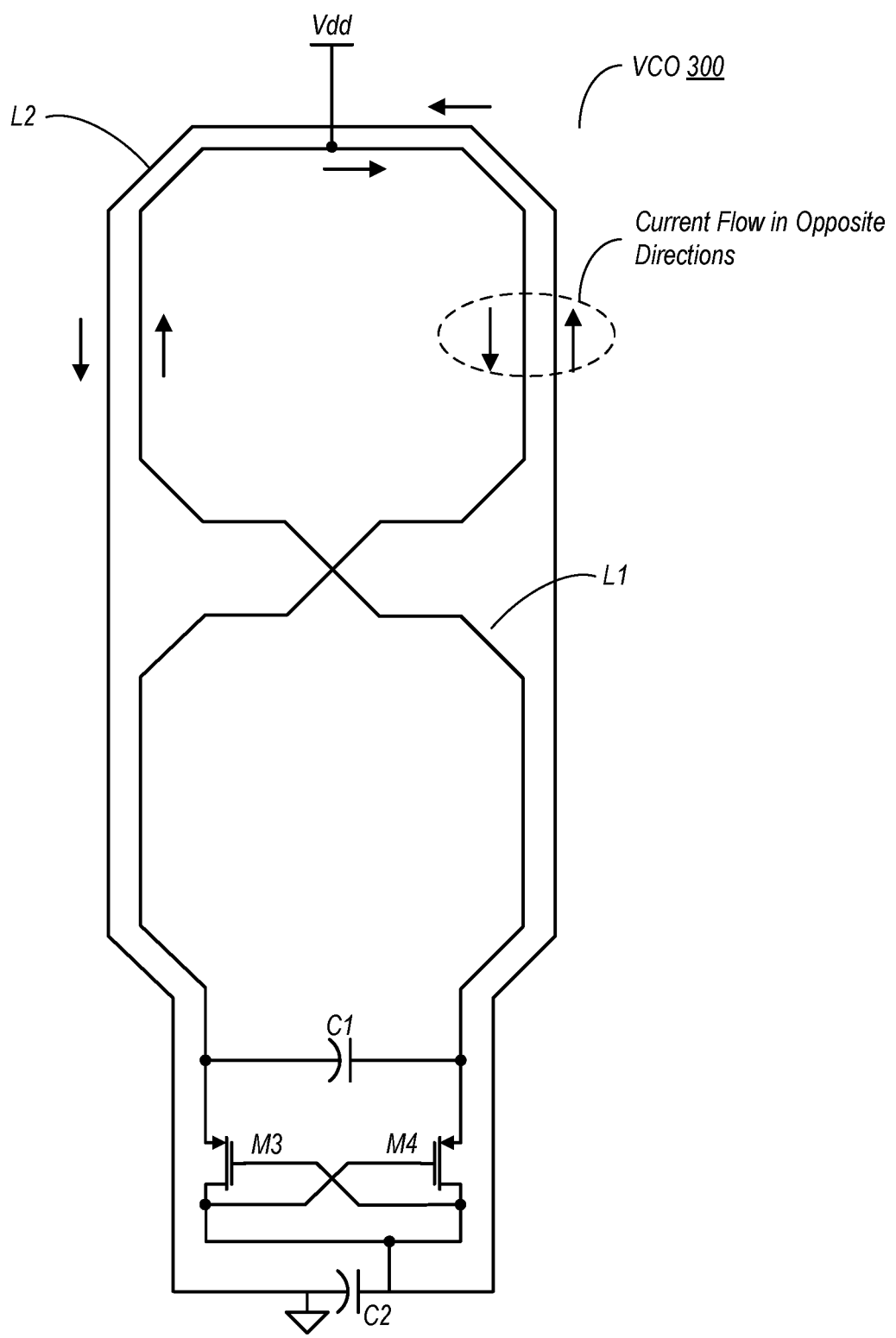
FIG. 3 is a schematic diagram of a third embodiment of a VCO.

FIG. 3 is another embodiment of a VCO including first and second inductors L1 and L2, with L1 arranged in a figure eight and L2 surrounding L1 and other circuitry in VCO 300. The primary difference between this embodiment and that of FIG. 2 is the use of PMOS devices M3 and M4 instead of the NMOS devices of that embodiment. It is further noted that the embodiment of FIG. 1 (which does not include capacitor C2) may also be implemented using PMOS devices.

Figure 4:
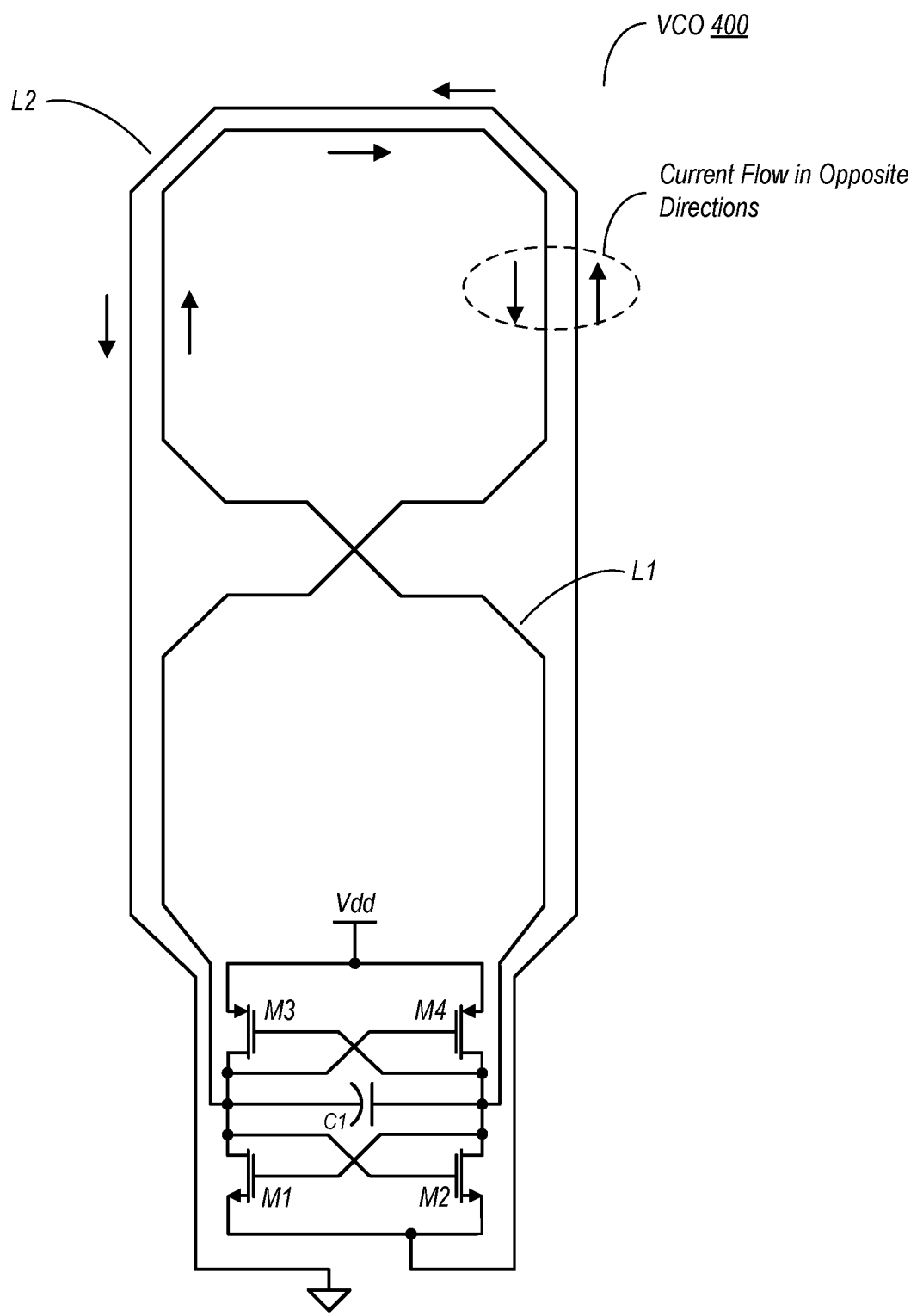
FIG. 4 is a schematic diagram of a fourth embodiment of a VCO.

FIG. 4 is yet another VCO embodiment. As shown in FIG. 4, VCO 400 includes two pairs of cross-coupled transistor, which may operate in a push-pull manner to produce a periodic signal. As with the previously illustrated embodiments, VCO 400 includes inductor L1, shaped as a figure eight, and inductor L2 effectively surrounding L1 and the other VCO circuitry. As with the embodiments of FIGS. 2 and 3, VCO 400 includes capacitor C2, although an embodiment with the transistor arrangement shown here but not including this capacitor is also possible and contemplated.

Figure 5:
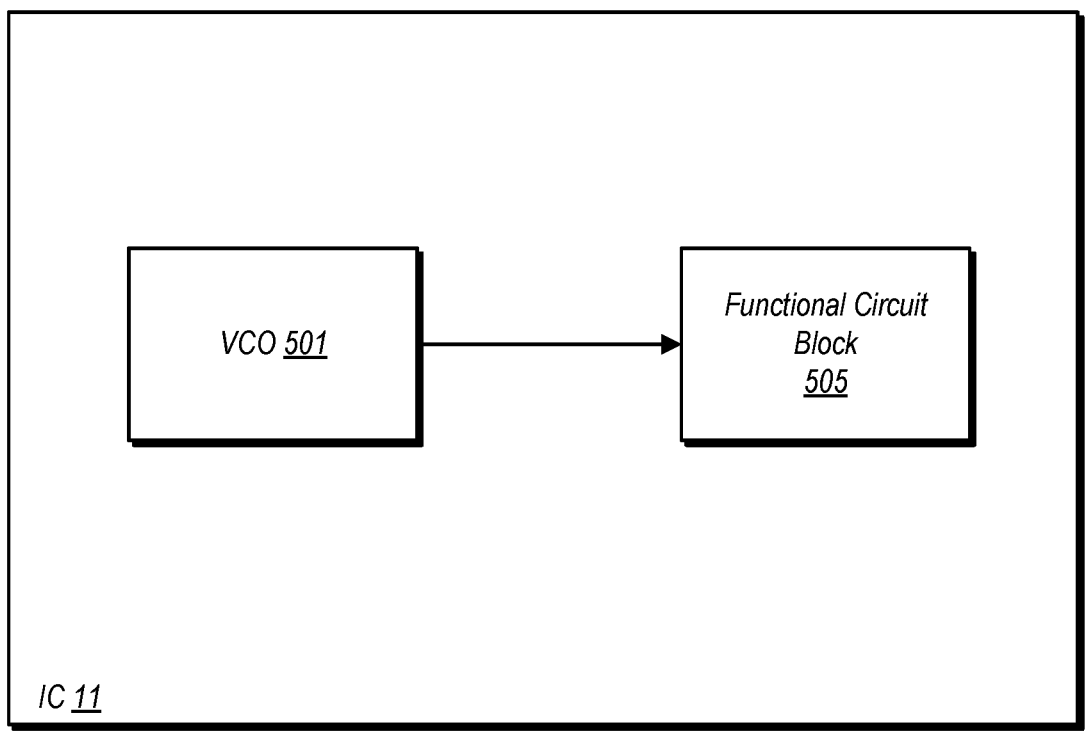
FIG. 5 is a block diagram of one embodiment of an integrated circuit (IC).

FIG. 5 is a block diagram of one embodiment of an IC that includes a VCO in accordance with this disclosure. It is noted that this is a simplified block diagram, and that other components/functional circuit blocks may be implemented thereon. Those that are shown here are done so for the purposes of illustration.

In the embodiment shown, IC 11 includes a VCO 501 and a functional circuit block 505. VCO 501 may be any of the VCO embodiments discussed above, and more generally, any VCO embodiment that falls within the scope of this disclosure. VCO 501 in the embodiment shown generates a periodic signal that is received by functional circuit block 505. The functional circuit block can be virtually any type of circuitry that receives and/or utilizes a periodic signal in its operation. For example, functional circuit block 505 may, in one embodiment, be a mixer in a radio frequency (RF) system, the mixer being used for upconversion (e.g., from baseband or intermediate frequency, IF, to RF) or downconversion (from RF to IF or baseband) of a modulated signal. In another example, functional circuit block 505 may be a signal shaping circuit that takes a sine wave from VCO 501 and generates a square wave periodic signal that can be used as a clock.

Figure 6:
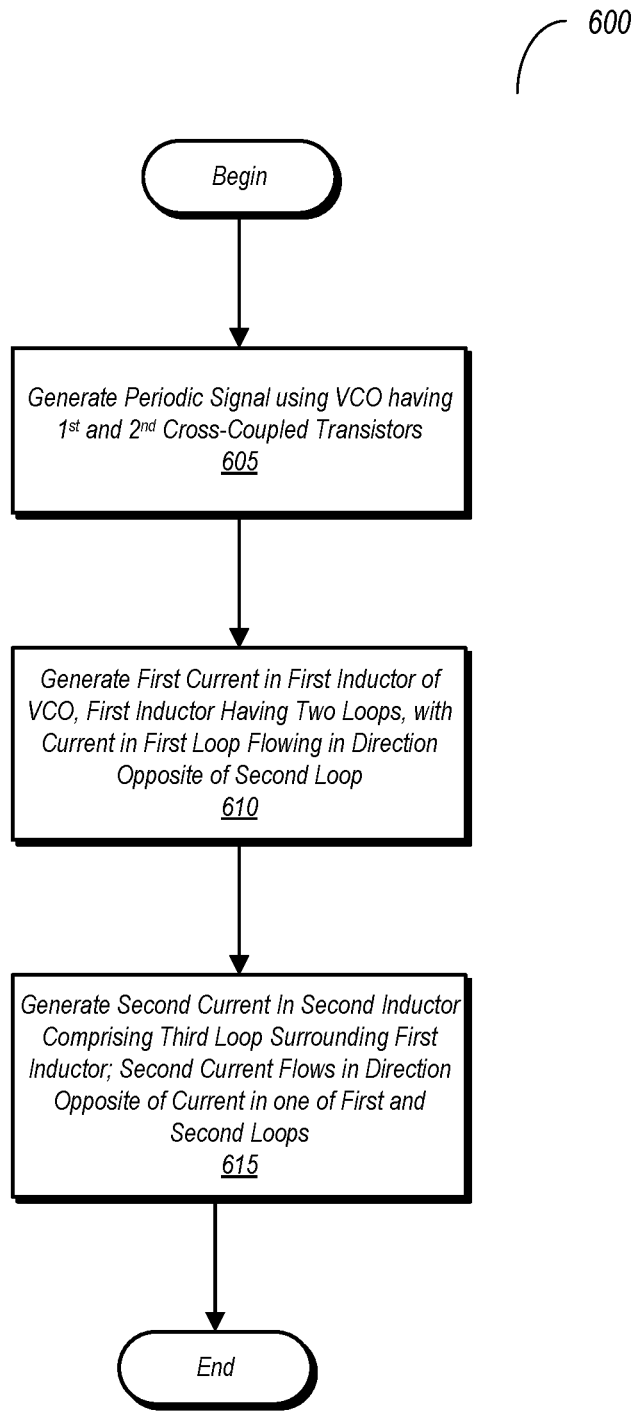
FIG. 6 is a flow diagram of one embodiment of a method for operating a VCO.

FIG. 6 is a flow diagram of one embodiment of a method for operating a VCO in accordance with this disclosure. Method 600 as shown here may be performed by any of the VCO embodiments discussed above, as well as any embodiment of a VCO not explicitly discussed herein but nevertheless falling within the scope of this disclosure.

Method 600 includes generating a periodic signal using a voltage controlled oscillator (VCO), the VCO including first and second transistors cross-coupled with one another (block 605). The method further includes generating a first current in first inductor of the VCO, the first inductor having first and second loops coupled to one another and arranged such that current in the first loop flows in a direction opposite of current in the second loop (block 610). The first inductor may be arranged to form a figure eight in the manner of the various embodiments discussed above and shown in FIGS. 1-4. The method further includes generating a second current in a second inductor, the second inductor comprising a third loop surrounding the first inductor, wherein the second current in the second inductor flows in a direction opposite of first current in one of the first and second loops (block 615). The second inductor may also be arranged in accordance with the various embodiments discussed above and shown in FIGS. 1-4.

By causing the current in one of the loops of the first inductor to flow opposite that of a current in the second inductor may result in the first inductor canceling electromagnetic signals received by the second inductor from a source external to the VCO. This may also result in the second inductor canceling electromagnetic signals generated by the VCO and conveyed by the first inductor.

Figure 7:
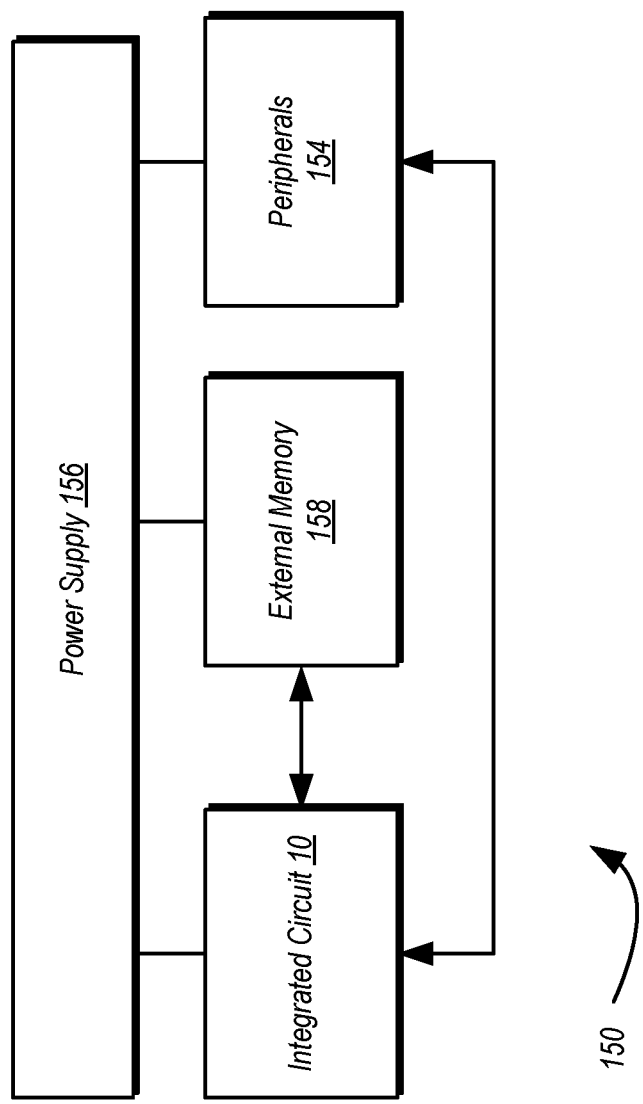
FIG. 7 is a block diagram of one embodiment of an example system.

Turning next to FIG. 7, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

Various embodiments of the IC 10 and/or peripherals 154 may include circuitry for implementing a VCO in accordance with the various embodiments discussed above. Such embodiments may additionally include various types of functional circuitry that utilize a periodic signal generated by a VCO.

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. A circuit comprising:
    a first transistor;
    a second transistor, wherein the first and second transistors are cross-coupled with one another;
    a first inductor having a first loop and a second loop, the first and second loops being coupled to one another, and wherein the first inductor is arranged such that current in the first loop flows in a direction opposite that of the second loop; and
    a second inductor arranged in a third loop, the third loop surrounding the first inductor wherein the third loop surrounds the first and second transistors and the first and second loops, and wherein the first and second transistors each include respective first terminals coupled to the first inductor and respective second terminals coupled to the second inductor;
    wherein the circuit forms a voltage controlled oscillator (VCO).

2. The circuit as recited in claim 1, wherein the first loop and the second loop of the first inductor are arranged to form a figure eight.

3. The circuit as recited in claim 1, further comprising a first capacitor coupled between respective drain terminals of the first and second transistors.

4. The circuit as recited in claim 3, further comprising a second capacitor implemented in the third loop.

5. The circuit as recited in claim 4, wherein a capacitance value of the first capacitor is based on a desired output frequency of the VCO.

6. The circuit as recited in claim 4, wherein a capacitance value of the second capacitor is based on a second harmonic of a desired output frequency of the VCO.

7. The circuit as recited in claim 1, wherein the first and second transistors are N-channel metal oxide semiconductor (NMOS) transistors, wherein respective drain terminals of the first and second transistors are coupled to the first inductor and wherein respective source terminals of the first and second transistors are coupled to the second inductor.

8. The circuit as recited in claim 1, wherein the first and second transistors are P-channel metal oxide semiconductor (PMOS) transistors, wherein respective drain terminals of the first and second transistors are coupled to the second inductor and wherein respective source terminals of the first and second transistors are coupled to the first inductor.

9. The circuit as recited in claim 1, further comprising third and fourth transistors cross-coupled with one another, wherein the first and second transistors are NMOS transistors, and wherein the third and fourth transistors are PMOS transistors, wherein respective drain terminals of the first, second, third and fourth transistors are coupled to the first inductor and wherein respective source terminals of the first and second transistors are coupled to the second inductor.

10. A method comprising:
generating a periodic signal using a voltage controlled oscillator (VCO), the VCO including first and second transistors cross-coupled with one another;
generating a first current in first inductor of the VCO, the first inductor having first and second loops coupled to one another and arranged such that current in the first loop flows in a direction opposite of current in the second loop, wherein respective first terminals of the first and second transistors are coupled to the first inductor; and
generating a second current in a second inductor, the second inductor comprising a third loop surrounding the first and second loops of the first inductor and the first and second transistors, and wherein respective second terminals of the first and second transistors are coupled to the second inductor, wherein the second current in the second inductor flows in a direction opposite of first current in one of the first and second loops.

11. The method as recited in claim 10, further comprising the first inductor canceling electromagnetic signals received by the second inductor from a source external to the VCO.

12. The method as recited in claim 10, further comprising the second inductor canceling electromagnetic signals generated by the VCO and conveyed by the first inductor.

13. An integrated circuit (IC) comprising:
a functional circuit coupled to receive a periodic signal;
a voltage controlled oscillator (VCO) configured to generate the periodic signal, wherein the VCO includes:
first and second transistors cross-coupled with one another;
a first inductor arranged in first and second loops forming a figure eight, wherein respective drain terminals of the first and second transistors are coupled to the first inductor; and
a second inductor formed as a third loop surrounding the first and second transistors and the first and second loops of the first inductor, wherein respective source terminals of the first and second transistors are coupled to the second inductor.

14. The IC as recited in claim 13, wherein the first inductor is configured to reject external electromagnetic interference received by the second inductor.

15. The IC as recited in claim 13, wherein the second inductor is configured to trap electromagnetic interference generated by the VCO.

16. The IC as recited in claim 13, wherein the VCO further comprises a first capacitor coupled between respective drain terminals of the first and second transistors, wherein a capacitance value of the first capacitor is based on a desired output frequency of the VCO.

17. The IC as recited in claim 16, wherein the VCO further comprises a second capacitor implemented in the third loop, wherein a capacitance value of the second capacitor is based on a first harmonic of a desired output frequency of the VCO.

18. The IC as recited in claim 13, wherein the first and second transistors are NMOS transistors having respective drain terminals coupled to the first inductor and respective source terminals coupled to the second inductor.

19. The IC as recited in claim 13, wherein the first and second transistors are PMOS transistors, wherein respective source terminals of the first and second transistors are coupled to the first inductor and wherein respective drain terminals of the first and second transistors are coupled to the second inductor.

20. The IC as recited in claim 13, wherein the VCO further comprises third and fourth transistors cross-coupled with one another, wherein the first and second transistors are NMOS transistors, and wherein the third and fourth transistors are PMOS transistors, wherein respective drain terminals of the first, second, third and fourth transistors are coupled to the first inductor, and wherein respective source terminals of first and second transistors are coupled to the second inductor.

* * * * *